(12) United States Patent
Knoedgen

(10) Patent No.: US 8,669,788 B2
(45) Date of Patent: Mar. 11, 2014

(54) MULTI-LEVEL OUTPUT COMPARATOR

(75) Inventor: Horst Knoedgen, Munich (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 0 days.

(21) Appl. No.: 13/535,451

(22) Filed: Jun. 28, 2012

(65) Prior Publication Data

US 2013/0214819 A1  Aug. 22, 2013

(30) Foreign Application Priority Data

Feb. 16, 2012  (EP) .................................... 12155723

(51) Int. Cl.
*H02M 11/00* (2006.01)
*H03F 3/45* (2006.01)

(52) U.S. Cl.
USPC ............................................. 327/103; 327/65

(58) Field of Classification Search
USPC .................................................. 327/65, 103
See application file for complete search history.

(56) References Cited

U.S. PATENT DOCUMENTS

| | | | |
|---|---|---|---|
| 7,358,776 B2 * | 4/2008 | Matsumoto | 327/18 |
| 2003/0169079 A1 | 9/2003 | Ebner | |
| 2006/0170461 A1 | 8/2006 | Bhattacharya et al. | |

FOREIGN PATENT DOCUMENTS

DE  102 11 013  7/2003

OTHER PUBLICATIONS

European Search Report 12155723.5-2215 Mail Date—Jul. 19, 2012, Dialog Semicomductor GmbH.

* cited by examiner

*Primary Examiner* — John Poos
(74) *Attorney, Agent, or Firm* — Saile Ackerman LLC; Stephen B. Ackerman

(57) ABSTRACT

The present document relates to a method and system for determining the voltage level of an input signal compared to a reference voltage, providing a plurality of level indications regarding an input voltage with respect to a reference voltage. The multi-level comparator comprises an input stage converting the input voltage into a first current and converting the reference voltage into a second current; and a plurality of comparator stages, each comprising a first current amplification unit amplifying the first current with a first gain, a second current amplification unit amplifying the second current with a second gain, and an output port providing an indication whether the first comparator current is smaller or larger than the second comparator current; wherein respective ratios of the first gain and the second gain of the plurality of comparator stages are different.

20 Claims, 4 Drawing Sheets

MULTI-LEVEL OUTPUT COMPARATOR

BACKGROUND OF THE INVENTION (1) Field of Invention

The present document relates to a multi-level output comparator. In particular, the present document relates to a method and system for determining the voltage level of an input signal compared to a reference voltage.

(2) Description of the Prior Art

Comparators are electronic devices which compare an input voltage with a reference voltage (or an input current with a reference current), and provide at their output an indication which of the two voltages (or currents) is greater. Comparators may be designed based on operational amplifiers with a particularly high gain. Such comparators suffer, however, from lengthy recovery times from saturation of the operational amplifiers, thereby limiting the frequency at which comparisons may be performed. Furthermore, such comparators only provide a single output, i.e. a single comparison, with no indication on how much the input voltage deviates from the reference voltage.

Flash analogue-to-digital converters (ADCs) make use of a plurality of comparators, in order to provide a more detailed analysis on how much the input voltage deviates from the reference voltage. Typically, a flash ADC makes use of a linear voltage ladder (i.e. a voltage divider) which divides the reference voltage Vref into a sequence of sub-voltage values (e.g. Vref/2, Vref/4, Vref/8, etc.). Furthermore, the flash ADC comprises a plurality of comparators (e.g. comparators based on operational amplifiers) which compares the input voltage with each of the sequence of sub-voltage values, respectively. As a result, an indication is provided on how much the input voltage Vin deviates from the reference voltage. Flash ADCs are disadvantageous in that they require a large number of dedicated comparators. Furthermore, flash ADCs may have limited speed (as a result of the limited speed of the plurality of comparators).

The present document addresses the shortcomings of the above mentioned comparators and flash ADCs. In particular, the present document describes a comparator which can operate at high frequencies and which provides a plurality of outputs for a single input (i.e. which provides a direct information on how far the input voltage Vin deviates from the reference voltage Vref, without the need of a plurality of distinct comparator circuits). The plurality of outputs of the described comparator may be used to implement a window comparator, thereby providing an indication of the range voltage of the input voltage Vin.

SUMMARY OF THE INVENTION

A principal object of the present invention is to achieve a comparator which provides a plurality of outputs for a single input (i.e. which provides a direct information on how far the input voltage Vin deviates from the reference voltage Vref, without the need of a plurality of distinct comparator circuits).

A further object of the invention is to achieve a comparator which can operate at high frequencies.

A further object of the invention is to implement a window comparator, thereby providing an indication of the voltage range of the input voltage Vin.

Moreover a further object of the invention is to achieve a high-speed comparator.

According to an aspect a multi-level comparator configured to provide a plurality of level indications regarding an input voltage Vin with respect to a reference voltage Vref is described. The multi-level comparator may comprise an input stage configured to convert the input voltage Vin into a first current and configured to convert the reference voltage Vref into a second current. The input stage may comprise a differential amplifier. The differential amplifier may be symmetrical with regards to the input voltage Vin and the first current on one side and the reference voltage Vref and the second current on the other side. The differential amplifier may comprise a first input transistor with the input voltage Vin being a gate voltage of the first input transistor. On the other side, the differential amplifier may comprise a second input transistor with the reference voltage Vref being a gate voltage of the second input transistor. The first and second input transistors may be arranged in series with a first and second transistor, respectively. The first transistor may provide the first current and the second transistor may provide the second current. In other words, the drain to source current of the first transistor may be the first current and the drain to source current of the second transistor may be the second current. Furthermore, the source to drain current of the first input transistor may be the first current and the source to drain current of the second input transistor may be the second current. The first and second currents may be provided by a current source positioned at a common source of the first and second input transistors. The current provided by the current source may be substantially equal to the sum of the first and second current. The current provided by the current source may be adjustable to calibrate the comparator.

Furthermore, the differential amplifier of the input unit may comprise two (or more) coupling resistors arranged to couple a drain and a gate of the first transistor and arranged to couple a drain and a gate of the second transistor, respectively. In a preferred embodiment, the differential amplifier comprises two equally valued coupling resistors. The gates of the first and second transistors may be coupled.

The multi-level comparator may further comprise a plurality of comparator stages. The number of comparator stages may be greater or equal to three, four, five, six, and ten. A comparator stage comprises a first current amplification unit configured to amplify or attenuate the first current with a first gain G1, thereby yielding a first comparator current at an output of the first current amplification unit. The first comparator current may be proportional to the first current. Furthermore, a comparator stage comprises a second current amplification unit configured to amplify or attenuate the second current with a second gain G2, thereby yielding a second comparator current at an output of the second current amplification unit. The second comparator current may be proportional to the second current. In addition, a comparator stage comprises an output port providing an indication whether the first comparator current is smaller or larger than the second comparator current. In other words, the output port may provide an indication whether the first current which is amplified or attenuated with the first gain G1 is smaller or larger than the second current which is amplified or attenuated with the second gain G2.

Typically, each of the plurality of comparator stages comprises the above mentioned components. The respective ratios of the first gain G1 and the second gain G2 of the plurality of comparator stages may be different, thereby providing a plurality of level indications of the input voltage Vin with respect to the reference voltage Vref.

The first and the second current amplification units of (some or all of) the plurality of comparator stages may comprise first and second current sources, respectively. The first current source may provide the first current amplified or attenuated with the first gain G1 (i.e. a first converter current). The second current source may provide the second current amplified or attenuated with the second gain G2 (i.e. a second converter current). By way of example, the first and the second current amplification units of (some or all of) the plurality of comparator stages may comprise a current mirror. In particular, for some or all of the plurality of comparator stages, the first current amplification unit may comprise a first converter transistor which forms a current mirror with the first transistor of the input stage. Furthermore, for some or all of the plurality of comparator stages, the second current amplification unit may comprise a second converter transistor which forms a current mirror with the second transistor.

For some or all of the plurality of comparator stages the output of the first current amplification unit (e.g. the drain of the first comparator transistor) and the output of the second current amplification unit (e.g. the drain of the second comparator transistor) may be coupled at the output port. In other words, for some or all of the plurality of comparator stages the first converter transistor and the second converter transistor may be coupled at the output port. In yet other words, the first current source and the second current source may be coupled at the output port.

Furthermore, the first current source may be coupled to the supply voltage and the second current source may be coupled to ground (or vice versa). The first current source may provide an amplified or attenuated first current (i.e. the first converter current) directed towards the supply voltage, and the second current source may provide an amplified or attenuated second current (i.e. the second converter current) directed towards ground (or vice versa). In particular, the first converter transistor may be coupled to a supply voltage and the second converter transistor may be coupled to ground (or vice versa). The first converter current may be directed towards the supply voltage and the second converter current may be directed towards ground. Hence the indication provided at the output port may be a high voltage value, if the first converter current is greater than the second converter current (of if the first current which is amplified or attenuated with the first gain G1 is greater than the second current which is amplified or attenuated with the second gain G2) and the indication may be a low voltage value, if the first converter current is smaller than the second converter current (or if the first current which is amplified or attenuated with the first gain G1 is smaller than the second current which is amplified or attenuated with the second gain G2). If the coupling of the first and second converter transistors to supply voltage/ground is inversed, then the indications at the output voltage may be inversed also.

The transistors of the multi-level comparator may be field effect transistors, e.g. metal oxide semiconductor field effect transistors. The multi-level comparator may be implemented as a single integrated circuit.

The multi-level comparator may be a latched comparator. For this purpose, some or all of the plurality of comparator stages may comprise a latch configured to store the indication provided at the corresponding output port. A plurality of latches of a plurality of comparator stages may be connected to a common clock, thereby synchronizing the plurality of latches.

It should be noted that the methods and systems including its preferred embodiments as outlined in the present document may be used stand-alone or in combination with the other methods and systems disclosed in this document. Furthermore, all aspects of the methods and systems outlined in the present document may be arbitrarily combined. In particular, the features of the claims may be combined with one another in an arbitrary manner.

BRIEF DESCRIPTION OF DRAWINGS

The invention will be explained in detail with reference to some drawings that are only intended to show embodiments of the invention and not to limit the scope. The scope of the invention is defined in the annexed claims and by its technical equivalents.

The invention is explained below in an exemplary manner with reference to the accompanying drawings, wherein The drawings show.

DETAILED DESCRIPTION OF EMBODIMENTS

Figure 1:
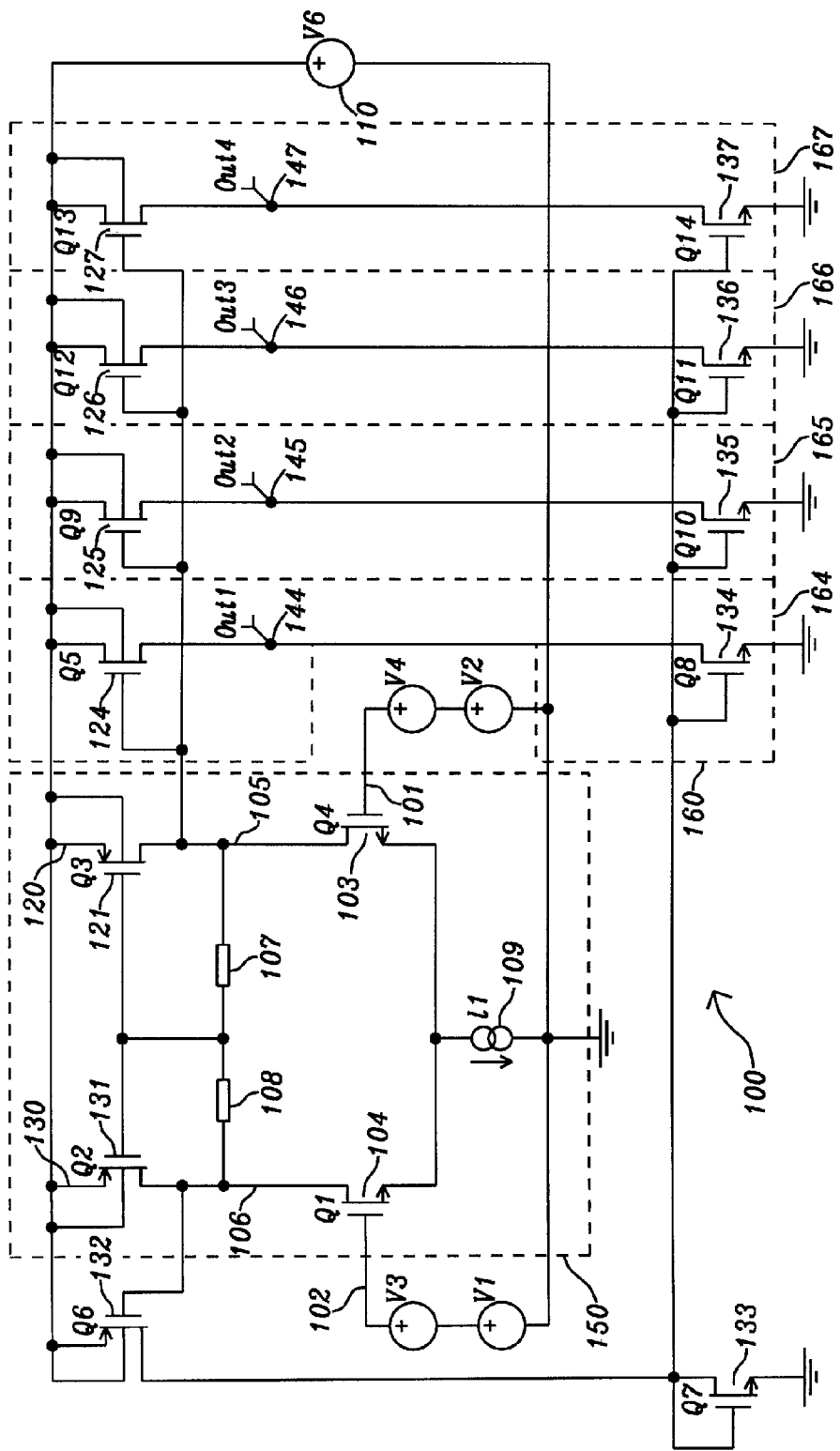
FIG. 1 illustrates a circuit diagram of an example multi-level output comparator.

FIG. 1 shows a circuit diagram of an example multi-level comparator 100. The comparator 100 comprises a gain unit 150 at its input. The gain unit 150 may be used to amplify/attenuate a voltage difference at the input of the gain unit 150 (i.e. the voltage difference between the input voltage Vin at a first input port 101 and the reference voltage Vref at a second input port 102), thereby yielding a voltage difference at the output voltage ports of the gain unit 150 (i.e. the voltage difference between the first output voltage at a first output voltage port 105 and the second output voltage at a second output voltage port 106). The example gain unit 150 of FIG. 1 is implemented as a differential amplifier comprising the (FET, e.g. MOSFET or CMOS) transistors 103, 104 and the resistors 107, 108.

In addition to providing amplification/attenuation, the gain unit 150 of FIG. 1 may be used to provide a differential current at a first output transistor 121 (i.e. at the first output current port 120) and a second output transistor 131 (i.e. at the second output current port 130). More precisely, the gain unit 150 is configured to split up the current provided by the current source 109 (e.g. 40 µA in the illustrated example) into a first output current (drain source current) through the first output transistor 121 and a second output current (drain source current) through the second output transistor 131. The difference between the first and second output currents (Io1 and Io2, respectively) is typically proportional to the voltage difference between the input voltage Vin at the first input port 101 and the reference voltage at the second input port 102, i.e. Io1−Io2=P*(Vin−Vref), wherein P is the proportionality factor. Overall, it may be stated that the gain unit 150 is configured to convert a voltage difference at its input (i.e. at the first and second input ports 101, 102) into a proportional current difference at its output (i.e. at the first and second output current ports 120, 130). It should be noted that dependent on the design of the gain unit 150, the proportionality factor P may be positive or negative.

The gain unit 150 of FIG. 1 may be designed in a symmetrical manner with regards to the input voltage Vin and the reference voltage Vref. As such, the transistors 103, 104 may be substantially symmetrical with respect to one another, the resistors 107, 108 may have substantially the same resistance, and the first and second output transistors 121, 131 may be substantially symmetrical with respect to one another. In the illustrated example, the transistors 103, 104 have widths and lengths of e.g. W=100 μm, L=1 μm; and the output transistors 121, 131 have widths and lengths of e.g. W=200 μm. The resistors 107, 108 are coupled with the common gate and the respective drains of the first and second output transistors 121, 131 (and may have a value of e.g. 10 kΩ each). In view of the symmetry of the gain unit 150, the first output current Io1 may be proportional to the input voltage Vin and the second output current Io2 may be proportional to the reference voltage Vref.

Furthermore, the comparator 100 comprises a comparator unit 160. The comparator unit 160 comprises a plurality of comparator stages 164, 165, 166, 167. In the illustrated example, four comparator stages are shown. It should be noted, however, that other number of comparator stages are possible. Each comparator stage 164, 165, 166, 167 comprises a respective first comparator transistor 124, 125, 126, 127 which is coupled to the first output transistor 121. Furthermore, each comparator stage 164, 165, 166, 167 comprises a respective second comparator transistor 134, 135, 136, 137 which is coupled to the second output transistor 131. The first comparator transistors 124, 125, 126, 127 are coupled to a supply voltage 110 of the multi-level comparator 100 (e.g. via their sources, respectively), and the second comparator transistors 134, 135, 136, 137 are coupled to ground (e.g. via their sources, respectively). Furthermore, respective first comparator transistors 124, 125, 126, 127 and second comparator transistors 134, 135, 136, 137 are coupled with one another (e.g. via their drains, respectively). The respective coupling points 144, 145, 146, 157 between the first comparator transistors 124, 125, 126, 127 and second comparator transistors 134, 135, 136, 137 constitute comparator output ports 144, 145, 146, 147 of the respective comparator stages 164, 165, 166, 167.

The gates of the first comparator transistors 124, 125, 126, 127 are coupled to the first output port 105. The gates of the second comparator transistors 134, 135, 136, 137 are coupled to the second output port 106 (via a plurality of intermediate transistors 132, 133). As outlined above, the intermediate transistors 132, 133 may be used for amplification/attenuation purposes of the second output current Io2. In the illustrated example, the first comparator transistors 124, 125, 126, 127 are PMOS transistors and the second comparator transistors 134, 135, 136, 137 are NMOS transistors.

In the following, the operation of the example comparator stage 164 is described in a representative manner. The operation of the other comparator stages 165, 166, 167 is analogous. The first comparator transistor 124 of the comparator stage 164 is coupled to the first output transistor 121 such that the current through the first comparator transistor 124 is proportional (e.g. equal) to the current through the first output transistor 121. This may be achieved by arranging the first output transistor 121 and the first comparator transistor 124 as a current mirror. The first proportionality (or gain) factor G1=Ic1/Io1, wherein Ic1 is the current through the first comparator transistor 124 and Io1 is the current through the first output transistor 121, may be dependent on the width W to length L ratios of the first output transistor 121 and the first comparator transistor 124, respectively. If Wo1 and Lo1 are the width and length of the first output transistor 121 and Wc1 and Lc1 are the width and length of the first comparator transistor 124, then the first proportionality (or gain) factor G1 may be given as G1=Wc1/Wo1*Lo1/Lc1. In the illustrated example, Wc1=Wo1=200 μm, Lc1=Lo1=5 μm, such that G1=1 and such that the current through the first comparator transistor 124 is substantially equal to the current through the first output transistor 121. (In the formulas "*" indicates the multiply operator and "/" indicates the divide operator). In the illustrated example, the width and length of the first comparator transistors 125, 126, 127 are Wc1=Wo1=200 μm, Lc1=Lo1=5 μm, such that G1=1.

In a similar manner, the second comparator transistor 134 of the comparator stage 164 is coupled to the second output transistor 131 such that the current through the second comparator transistor 134 is proportional (e.g. equal) to the current through the second output transistor 131. In the illustrated example, this is achieved by using a plurality of intermediate current mirrors comprising the transistors 132, 133 (the second output transistor 131 having e.g. W=200 μm, L=5 μm; the transistor 132 having e.g. W=200 μm, L=5 μm; and the transistor 133 having e.g.

W=100 μm, L=5 μm). In the illustrated example, the intermediate current mirrors lead to an intermediate gain of Gi=1. Overall, the current Ic2 through the second comparator transistor 134 is proportional to the current Io2 through the second output transistor 131 with G2 being the second proportionality (gain) factor, G2=Ic2/Io2. As outlined above, the second proportionality factor G2 may be designed using the width W and/or length L of the transistors 131, 132, 133, 134 involved in the current mirroring operation. In the illustrated example G2=Wc2/Wo2*Lo2/Lc2*Gi, with Wo2 and Lo2 being the width and length of the second output transistor 131 and Wc2 and Lc2 being the width and length of the second comparator transistor 134. In the illustrated example, Wo2=200 μm, Wc2=170μ, Lc2=Lo2=5 μm, such that G2=1.7. The width and length of the second comparator transistors 135, 136, 137 are Wc2=150 μm, 130 μm, 140 μm, respectively, and Lc2=5 μm in the illustrated example.

In FIG. 1, the lengths L of the transistors have been maintained constant (at 5 μm), whereas the widths W of the transistors have been varied. It should be noted that in general, the lengths L and/or the widths W may be varied to adjust the proportionality factors G1 and G2 (in accordance to the formulas provided above).

Hence, the current Ic1 through the first comparator transistor 124 should be Ic1=G1*Io1 and the current Ic2 through the second comparator transistor 134 should be Ic2=G2*Io2. Both currents, i.e. Ic1 and Ic2, are coupled with the comparator output port 144. Consequently, both currents, i.e. Ic1 and Ic2 should be equal. However, if Ic1 (i.e. G1*Io1) is greater than Ic2 (i.e. G2*Io2), then the first comparator transistor 124 saturates, such that the voltage at the first comparator output port 144 is equal to (or close to) the supply voltage 110, thereby indicating a high state. On the other hand, if Ic1 (i.e. G1*Io1) is smaller than Ic2 (i.e. G2*Io2), then the second comparator transistor 134 saturates, such that the voltage at the comparator output port 144 is equal to (or close to) ground, thereby indicating a low state.

Consequently, the voltage (high state or low state) at the comparator output port 144 provides an indication with regards to the difference between Ic1 and Ic2. In particular, the voltage (high state or low state) at the comparator output port 144 indicates if Ic1 (i.e. G1*Io1) is greater or smaller than Ic2 (i.e. G2*Io2).

It should be noted that due to the coupling of the first comparator transistor 124 and the second comparator transistor 134 at the comparator output port 144, the currents through the first and second comparator transistors 123, 134 may actually differ from Ic1 and Ic2, respectively. However, the state of the comparator output port 144 indicates whether the current Ic1=G1*Io1 which should flow through the first comparator transistor 124 is higher or lower than the current Ic2=G2*Io2 which should flow through the second comparator transistor 134.

As such, the comparator stage 164 comprises a first comparator transistor 124 trying to provide a current Ic1=G1*Io1 and a second comparator transistor 134 trying to provide a current Ic2=G2*Io2. In general terms, the first and second comparator transistors 124, 134 may be current sources 124, 134. In FIG. 1 the first comparator transistor 124 is implemented as a P channel transistor, thereby providing a current Ic1 towards the supply voltage, and the second comparator transistor 134 is implemented as an N channel transistor, thereby providing a current Ic2 towards ground. In general terms, the comparator stage 164 may comprise a first current source 124 which supplies a current towards the supply voltage and a second current source 134 which supplies a current towards ground (or vice versa). The first and second current source 124, 134 are coupled to each other at the output port 144. Depending on the currents Ic1, Ic2 supplied by the current sources 124, 134, the output port 144 is placed into the high state or into the low state.

Consequently, the first and second comparator transistors 124, 134 may be implemented as first and second current sources 124, 134. By way of example, the first and second current sources 124, 134 may comprise a cascade of transistors (i.e. a cascade of first and second comparator transistors), respectively. A cascade of transistors may be beneficial with regards to the achievable gain G1, G2 and/or with regards to the linearity of the current source/current mirror. It should be noted that there are other possibilities for implementing the first and second current sources 124, 134 adapted to supply the first and second comparator currents Ic1, Ic2, respectively.

As indicated above, the voltage at the second input port 102 may be the reference voltage Vref and the voltage at the first input port 101 may be the input voltage Vin. The multi-level comparator 100 may be used to provide an indication on how far the input voltage Vin deviates from the reference voltage Vref. As outlined above the gain unit 150 provides a first and second output current Io1, Io2, the difference of which being proportional to the difference between Vin and Vref, Io1−Io2=P*(Vin−Vref), wherein the proportionality factor P depends on the parameters of the transistors 103, 104 and the resistors 107, 108 of the gain unit 150. As a result of the comparator stage 164, it is known whether Io1 is greater or smaller than G2/G1*Io2.

As shown in FIG. 1, the multi-level comparator 100 and in particular the comparator unit 160 comprises a plurality of comparators stages 164, 165, 166, 167. Each of the plurality of comparators stages 164, 165, 166, 167 may implement a different proportionality ratio G2/G1. In the illustrated example, G1 is constant at G1=1 for all the plurality of comparators stages 164, 165, 166, 167, whereas the proportionality factor G2 takes on the values 1.7, 1.5, 1.3 and 1.4 for the comparators stages 164, 165, 166, 167, respectively. The different proportionality factors G2 are implemented using different width values Wc2 for the respective second comparator transistors 134, 135, 136, 137, respectively. The different proportionality ratios G2/G1 of the different comparators stages 164, 165, 166, 167 may be referred to as $r_n$=G2/G1 with n=1, ..., N, wherein N is the total number of comparator stages 164, 165, 166, 167 and wherein the index n indicates a respective comparator stage 164, 165, 166, 167. The N comparator stages provide at their comparator output ports 144, 145, 146, 147 (high voltage/high state or low voltage/low state) an indication whether Io1 is greater or smaller than $r_n$*Io2, for n=1, ..., N.

Hence, the multi-level comparator 100 provides a sequence of N binary voltage values (high voltage/high state, i.e. voltage close to the supply voltage; or low voltage/low state, i.e. voltage close to ground) at the N comparator output ports 144, 145, 146, 147. This sequence of binary voltage values corresponds to a sequence of parallel comparisons with regards to the first output current Io1 and the second output current Io2. This sequence of parallel comparisons indicates how close (or how far) the first output current Io1 is to the second output current Io2. The number N (i.e. the number of comparator stages) may be varied in accordance to the resolution requirements of the multi-level comparator. Furthermore, the values of the proportionality ratios $r_n$ may be selected based on the resolution requirements. By way of example, the proportionality ratios $r_n$ may define a linear scale at a pre-determined level of resolution.

TABLE 1

| $r_n$ | state |
|---|---|
| 1.7 | 0 |
| 1.5 | 0 |
| 1.3 | 1 |
| 1.4 | 1 |

Table 1 lists the example proportionality ratios $r_n$, n=1, ..., N=4, of the plurality of comparator stages 164, 165, 166, 167. Furthermore, Table 1 lists example states at the corresponding plurality of comparator output ports 144, 145, 146, 147, wherein "0" indicates a low state, i.e. Io1<$r_n$*Io2, and wherein "1" indicates a high state, i.e. Io1>$r_n$*Io2. From the example shown in Table 1, it can be concluded that 1.4*Io2<Io1<1.5*Io2.

As indicated above, the difference of the first and second output currents is typically proportional to the difference of the input voltage Vin and the reference voltage Vref, i.e. Vin−Vref=(Io1−Io2)/P. In view of the symmetry of the gain unit 150 (i.e. of the differential amplification stage), in particular, in view of the symmetry of the resistors 107, 108 (and the symmetry of the transistors 103, 104), it can be stated that the input voltage Vin is proportional to the first output current Io1, i.e. Vin=Io1/P, and that the reference voltage Vref is proportional to the second output current Io2, i.e. Vref=Io2/P. Consequently, the comparison results with regards to the first and second output currents Io1, Io2 directly translate into comparison results with regards to the input voltage Vin and the reference voltage Vref. In particular, the N comparator stages 164, 165, 166, 167 provide at their comparator output ports 144, 145, 146, 147 (high voltage/high state or low voltage/low state) an indication whether Vin is greater or smaller than $r_n$*Vref, for n=1, ..., N. By way of example, it can be concluded from the example shown in Table 1 that 1.4*Vref<Vin<1.5*Vref.

The multi-level comparator 100 may be calibrated in order to be operable in a certain voltage range. The calibration may be performed by varying the current provided by the current source 109. By way of example, the range of the comparator levels may be adjusted by adjusting the gain of the gain unit 150 (e.g. via the current provided by the current source 109). The gain of the gain unit 150 may be controlled using automatic gain control (AGC) schemes.

Figure 2:
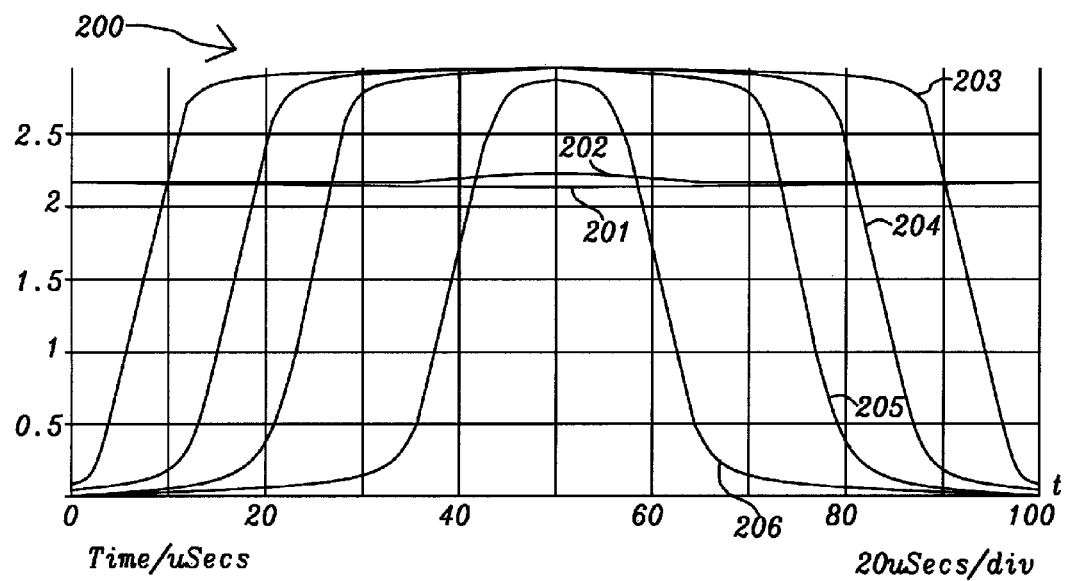
FIG. 2 shows example output voltages of the multi-level output comparator of FIG. 1.

FIG. 2 shows example voltages 200 at the comparator output ports 144, 145, 146, 147 of the multi-level comparator 100 of FIG. 1. FIG. 2 illustrates a reference voltage Vref 201 which remains constant along the time t (i.e. along the x-axis). To be precise, FIG. 2 shows the second output voltage at the second output port 106 which is proportional to the reference voltage Vref (by the gain factor of the gain unit 150). Furthermore, FIG. 2 shows the input voltage Vin 202 which initially is equal to Vref, then increases along an increasing ramp to a peak voltage, then decreases, again along a decreasing ramp to Vref. To be precise, FIG. 2 shows the first output voltage at the first output port 105 which is proportional to the input voltage Vin (by the gain factor of the gain unit 150). The peak voltage of Vin 202 is only approximately 100 mV above Vref 201. Nevertheless, it can be seen that the multi-level comparator 100 provides clear indications of the (small) differences between Vin and Vref. In other words, FIG. 2 illustrates the sensitive of the multi-level comparator 100.

It can be seen that with increasing Vin, the voltages at the comparator output ports 144, 145, 146, 147 go from a low voltage (low state) to a high voltage (high state). The first comparator output port to go from low state to high state is the comparator output port 146 (voltage curve 203), thereby indicating that Vin>1.3Vref. Subsequently, the comparator output port 147 (voltage curve 204), the comparator output port 145 (voltage curve 205) and the comparator output port 144 (voltage curve 206) go from low state to high state, thereby indicating that Vin>1.4Vref, Vin>1.5Vref and Vin>1.7Vref, respectively. As the input voltage Vin is decreased again, the comparator output ports 144, 145, 146, 147 go back from high state to low state. As such, FIG. 2 illustrates how the multi-level comparator 100 of FIG. 1 may be used to provide a precise indication on how far the input voltage Vin deviates from the reference voltage Vref.

In other words, FIG. 1 illustrates a comparator 100 with multiple outputs. The underlying principle of the comparator 100 may be viewed as increasing the resolution of a fixed level, in order to determine how far away the signal Vin is from the reference voltage Vref. In the illustrated example, a current at the first comparator transistors Ic1 derived from the input voltage Vin is maintained at a fixed level and this current Ic1 is compared to a plurality of different currents at the second comparator transistors Ic2 derived from a plurality of different multiples/fractions of the reference voltage Vref. The multi-level comparator 100 provides a measure (within a single shot or clock) on how close the input voltage Vin is to the reference voltage Vref. An accurate measurement may be provided by calibrating the comparator 100, e.g. by adjusting the current provided by the current source 109.

As outlined above, the example comparator 100 of FIG. 1 comprises a first stage 150 (i.e. the gain unit 150) which is acting as a gain stage amplifier. The gain unit 150, i.e. notably the gain of the gain unit 150, may be adjusted by a current provided by a current source 109. Furthermore, the comparator 100 comprises a comparator unit 160 with a plurality of comparator stages 164, 165, 166, 167. Each comparator stage 164 comprises two transistors (first and second comparator transistors 124, 134) which act as current sources. These current sources (i.e. the current provided by these current sources) may have a defined offset with respect to one another. This offset may be defined by the design of the different width/length (W/L) parameters of the transistors. In case of a zero offset, the current sources may be matched.

It should be noted that the comparator 100 can act as a window comparator. In particular, the comparator 100 may determine whether the input voltage Vin lies within a defined interval [$r_i$*Vref, $r_j$*Vref], wherein i, j=1, N. The resolution of the interval may be set by selecting the number N of comparator stages and/or by selecting appropriate ratios $r_n$.

Figure 3:
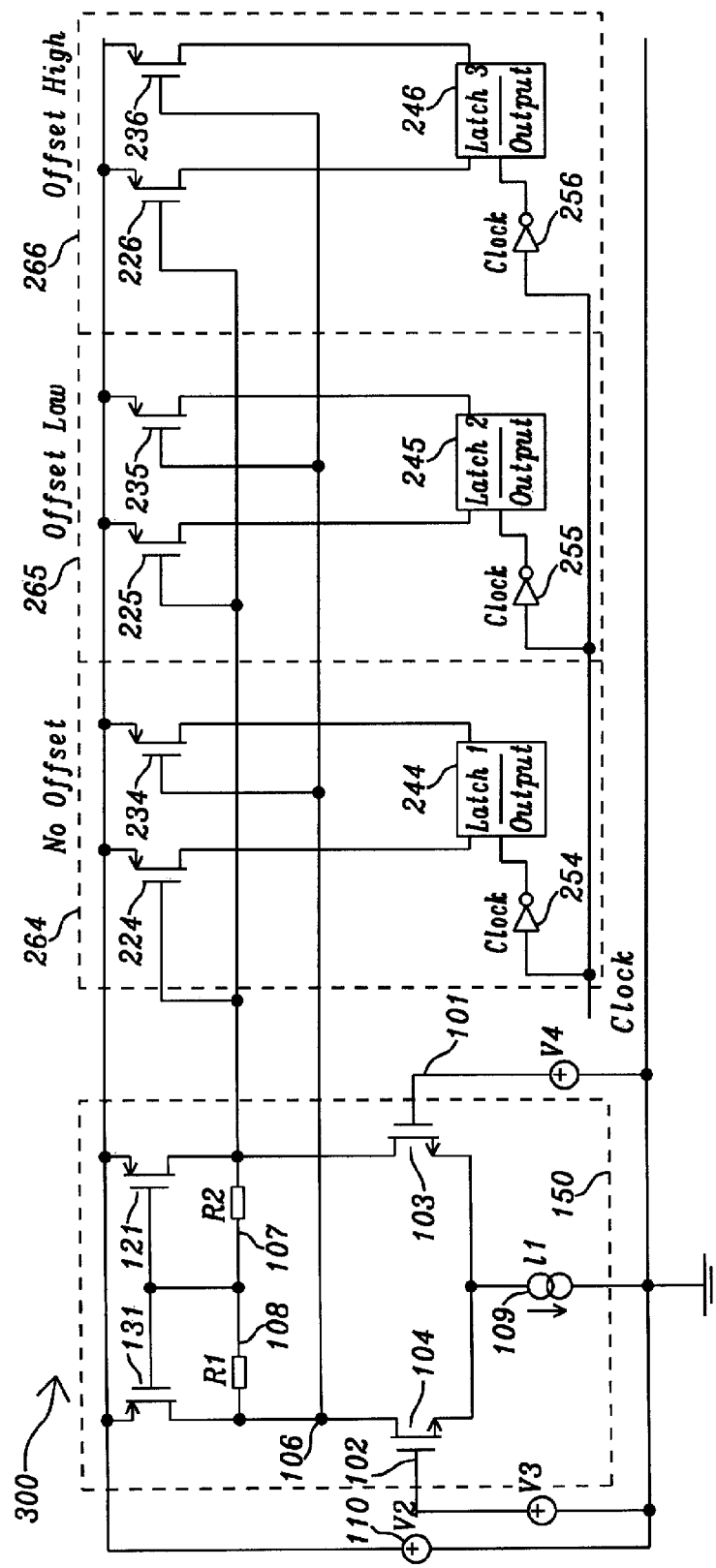
FIG. 3 illustrates a circuit diagram of an example latch multi-level output comparator.

FIG. 3 illustrates the circuit diagram of a latched multi-level comparator 300. Similar to the comparator 100 of FIG. 1, the comparator 300 comprises a gain unit 150 which is configured to provide a first and second output current at the first and second output transistors 121, 131, based on the input voltage Vin and the output voltage Vref. The example comparator 300 comprises three comparator stages 264, 265, 266. The comparator stage 264 comprises a first comparator transistor 224 (coupled to the first output transistor 121) and a second comparator transistor 234 (coupled to the second output transistor 131). In a similar manner, the comparator stage 265 comprises a first comparator transistor 225 (coupled to the first output transistor 121) and a second comparator transistor 235 (coupled to the second output transistor 131). Furthermore, the comparator stage 266 comprises a first comparator transistor 226 (coupled to the first output transistor 121) and a second comparator transistor 236 (coupled to the second output transistor 131). As already outlined in the context of FIG. 1, the respective first comparator transistors 224, 225, 226 respectively form a current mirror with the first output transistor 121 with a respective first proportionality factor G1. Furthermore, the respective second comparator transistors 234, 235, 236 forth a current mirror with the second output transistor 131 with a respective second proportionality factor G2.

In a first comparator stage 264, the current Ic1 through the first comparator transistor 224 is compared to the current Ic2 through the second comparator transistor 234, and the comparison result is stored in a latch 244. The latch may be clocked using a clocking unit 254. A second comparator stage 264 and a third comparator stage 266 are designed accordingly (with different proportionality ratios $r_n$). Using the clocking units 254, 255, 256 of the plurality of comparator stages 264, 265, 266, the latches 244, 245, 246 of the plurality of comparator stages 264, 265, 266 can be synchronized, thereby providing a synchronized output of the plurality of comparator stages 264, 265, 266. The states (high state or low stage) stored within the plurality of latches 244, 245, 246 provide an indication on how far the input voltage Vin deviates from the reference voltage Vref. In the illustrated example of FIG. 3, the plurality of latches 244, 245, 246 indicate whether there is no (or little) offset between Vin and Vref (comparator stage 264), whether there is a low offset between Vin and Vref (comparator stage 265) or whether there is a high offset between Vin and Vref (comparator stage 266).

In the illustrated example of FIG. 3, the width and length of the transistors 103, 104 are W=100 μm, L=1 μm, the width and length of the output transistors 121, 131 are W=10 μm, L=0.35 μm, the width and length of the comparator transistors 224, 234 are W=10 μm, L=0.35 μm, the width and length of the comparator transistors 225, 235 are W=10 μm and W=15 μm, respectively, and L=0.35 μm, and the width and length of the comparator transistors 226, 236 are W=10 μm and W=20 μm, respectively, and L=0.35 μm. The resistance of the resistors 107, 108 is 1 kΩ, each. The current provided by the current source 109 is 20 μA in the illustrated example.

Figure 4:
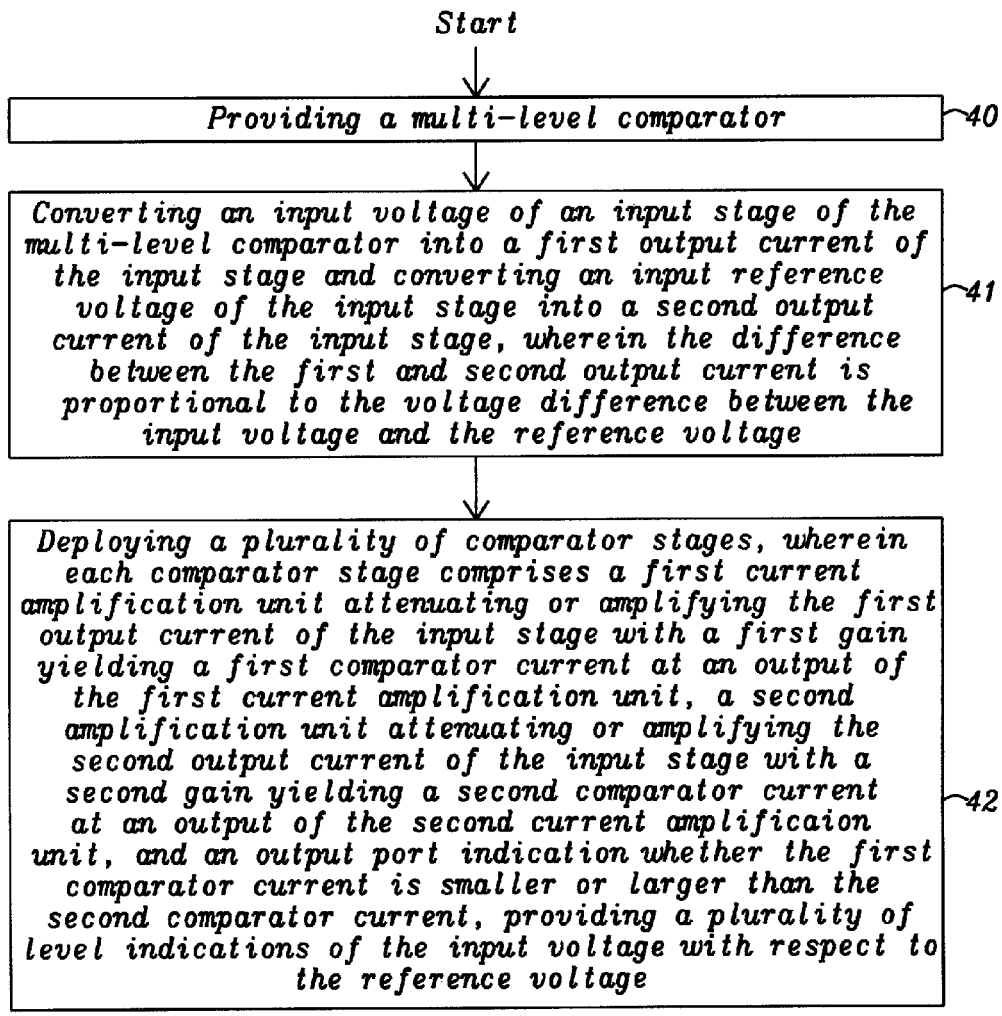
FIG. 4 illustrates a flowchart of a method for determining the voltage level of an input signal multi-level compared to a reference voltage.

FIG. 4 illustrates a flowchart of a method for determining the voltage level of an input signal multi-level compared to a reference voltage. Step 40 of the method of FIG. 4 depicts the provision of providing a multi-level comparator for generating a plurality of level indications regarding an input voltage with respect to a reference voltage. Step 41 shows converting an input voltage of an input stage of the multi-level comparator into a first output current of the input stage and converting an input reference voltage of the input stage into a second output current of the input stage, wherein the difference between the first and second output current is proportional to the voltage difference between the input voltage and the reference voltage. Step 42 illustrates finally deploying a plurality of comparator stages, wherein each comparator stage comprises a first current amplification unit attenuating or amplifying the first output current of the input stage with a first gain yielding a first comparator current at an output of the first current amplification unit, a second amplification unit attenuating or amplifying the second output current of the input stage with a second gain yielding a second comparator current at an output of the second current amplification unit, and an output port indicating whether the first comparator current is smaller or larger than the second comparator current, providing a plurality of level indications of the input voltage with respect to the reference voltage.

In the present document, various designs of multi-level comparators have been described. The multi-level comparators described herein may be used as flash ADC or window comparators. Furthermore, the multi-level comparators may be used for regulation purposes, where the speed/degree of regulation may be adjusted based on a degree of deviation of an input voltage Vin from a reference voltage (wherein the degree of deviation may be determined using the multi-level comparators described herein). The multi-level comparators described herein comprise one input and multiple outputs. The multiple outputs typically do not constitute a large capacitive load with respect to the input. In particular, the input voltage Vin only "sees" the first input transistor 103 having a relatively low gate capacitance. As a consequence of the low input capacitance, the multi-level comparators described herein can react quickly to changing input voltages Vin. In other words, the multi-level comparators described herein can be operated at high detection frequencies.

The multi-level comparator allows a direct determination of how close the input voltage is with regards to a target reference or target range. The multi-level comparators described herein provide a simple architecture (i.e. a low cost architecture) and are compatible with high detection frequencies (i.e. a high clocking rate). Furthermore, the multi-level comparators described herein may be implemented on a single integrated circuit.

In the present document, the term "couple" or "coupled" refers to elements being in electrical communication with each other, whether directly connected e.g., via wires, or in some other manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

Although the invention is described using specific embodiments, it will be clear that multiple methods and arrangements are possible within the scope of the invention. The skilled person will be able to combine, adapt, change or leave out one or more of the disclosed specific features of the embodiments.

What is claimed is:

1. A multi-level comparator configured to provide a plurality of level indications at a plurality of output ports of a respective plurality of comparator stages, the plurality of level indications regarding an input voltage Vin with respect to a reference voltage Vref, the multi-level comparator comprising an input stage configured to convert the input voltage Vin into a first current and configured to convert the reference voltage Vref into a second current; and the plurality of comparator stages, each comparator stage comprising a first current amplification unit configured to amplify or attenuate the first current with a first gain G1, thereby yielding a first comparator current at an output of the first current amplification unit;

a second current amplification unit configured to amplify or attenuate the second current with a second gain G2, thereby yielding a second comparator current at an output of the second current amplification unit; and the respective output port providing an indication whether the first comparator current is smaller or larger than the second comparator current;

wherein respective ratios of the first gain G1 and the second gain G2 of the plurality of comparator stages are different, thereby providing a plurality of level indications of the input voltage Vin with respect to a reference voltage Vref.

2. The multi-level comparator of claim 1, wherein for at least some of the plurality of comparator stages the first and the second current amplification units comprise a first and second current source, respectively.

3. The multi-level comparator of claim 1, wherein for each of the plurality of comparator stages the output of the first current amplification unit and the output of the second current amplification unit are coupled at the output port.

4. The multi-level comparator of claim 1, wherein for at least some of the plurality of comparator stages the indication is a high voltage value, if the first converter current is greater than the second converter current; and the indication is a low voltage value, if the first converter current is smaller than the second converter current.

5. The multi-level comparator of claim 1, wherein the input stage comprises a first transistor providing the first current and a second transistor providing the second current;

for each of the plurality of comparator stages, the first current amplification unit comprises a first converter transistor which forms a current mirror with the first transistor; and for each of the plurality of comparator stages, the second current amplification unit comprises a second converter transistor which forms a current mirror with the second transistor.

6. The multi-level comparator of claim 5, wherein for each of the plurality of comparator stages the first converter transistor and the second converter transistor are coupled at the output port.

7. The multi-level comparator of claim 6, wherein for at least some of the plurality of comparator stages the first converter transistor is coupled to a supply voltage; and the second converter transistor is coupled to ground.

8. The multi-level comparator of claim 5, wherein the transistors are field effect transistors, e.g. metal oxide semiconductor field effect transistors.

9. The multi-level comparator of claim 1, wherein the input stage comprises a current source configured to supply an input current, wherein the input current corresponds to the sum of the first and the second currents.

10. The multi-level comparator of claim 9, wherein the input current provided by the current source is adjustable to calibrate the comparator.

11. The multi-level comparator of claim 5, wherein the input stage comprises a differential amplifier, wherein the differential amplifier is symmetrical and comprises:
- a first input transistor with the input voltage Vin being a gate voltage of the first input transistor;
- a second input transistor with the reference voltage Vref being a gate voltage of the second input transistor; and
- at least two coupling resistors arranged to couple a drain and a gate of the first transistor and to couple a drain and a gate of the second transistor, respectively.

12. The multi-level comparator of claim 11, wherein
- the first current is a source drain current of the first input transistor; and
- the second current is a source drain current of the second input transistor.

13. The multi-level comparator of claim 1, wherein the plurality of comparator stages comprises
- a plurality of latches configured to store the indication provided at the corresponding plurality of output ports, respectively.

14. The multi-level comparator of claim 13, wherein the plurality of latches are connected to a common clock.

15. The multi-level comparator of claim 1, comprising a number of comparator stages greater or equal to three.

16. A method for determining the voltage level of an input signal multi-level compared to a reference voltage comprising steps of:
- providing a multi-level comparator for generating a plurality of level indications at a plurality of output ports of a respective plurality of comparator stages, the plurality of level indications regarding an input voltage with respect to a reference voltage;
- converting an input voltage of an input stage of the multi-level comparator into a first output current of the input stage and converting an input reference voltage of the input stage into a second output current of the input stage, wherein the difference between the first and second output current is proportional to the voltage difference between the input voltage and the reference voltage; and
- deploying a plurality of comparator stages, wherein each comparator stage comprises a first current amplification unit attenuating or amplifying the first output current of the input stage with a first gain yielding a first comparator current at an output of the first current amplification unit, a second amplification unit attenuating or amplifying the second output current of the input stage with a second gain yielding a second comparator current at an output of the second current amplification unit, and an output port indicating whether the first comparator current is smaller or larger than the second comparator current, providing a plurality of level indications of the input voltage with respect to the reference voltage.

17. The method of claim 16 wherein the said first and second output currents of the input stage are provided by a current source wherein the current provided by the current source is adjustable to calibrate the comparator.

18. The method of claim 16 wherein the number of said comparator stages is higher than two.

19. The method of claim 16 wherein said providing of a plurality of level indications is possible because respective ratios of the first gain and the second gain of the plurality of comparator stages are different.

20. The method of claim 16 wherein said the indication provided by one of output ports may be a high voltage value, if the first converter current is greater than the second converter current and the indication may be a low voltage value, if the first converter current is smaller than the second converter current.

* * * * *